United States Patent
Hu et al.

[19]

[11] Patent Number: 6,141,767
[45] Date of Patent: Oct. 31, 2000

[54] METHOD OF AND APPARATUS FOR VERIFYING RELIABILITY OF CONTENTS WITHIN THE CONFIGURATION ROM OF IEEE 1394-1995 DEVICES

[75] Inventors: Qi Hu, Santa Clara; Hisato Shima, Saratoga, both of Calif.

[73] Assignees: Sony Corporation, Tokyo, Japan; Sony Electronics, Inc., Park Ridge, N.J.

[21] Appl. No.: 09/055,132

[22] Filed: Apr. 3, 1998

[51] Int. Cl.[7] .................................................. G06F 11/00
[52] U.S. Cl. .................................. 714/1; 365/201
[58] Field of Search .................... 714/1, 2, 5, 7, 714/20, 25, 27, 31, 39, 54, 4, 30, 718, 736; 365/185.22, 201; 364/491

[56] References Cited

U.S. PATENT DOCUMENTS

| | | | |
|---|---|---|---|
| 4,238,852 | 12/1980 | Iga et al. | 371/40 |
| 4,726,028 | 2/1988 | Himeno | 371/37 |
| 4,788,684 | 11/1988 | Kawaguchi et al. | 371/21 |
| 4,881,232 | 11/1989 | Sako et al. | 371/37.4 |
| 4,910,736 | 3/1990 | Tanaka et al. | 371/37.7 |
| 5,001,714 | 3/1991 | Stark et al. | 371/26 |
| 5,020,011 | 5/1991 | Stark et al. | 364/580 |
| 5,517,508 | 5/1996 | Scott | 371/37.1 |
| 5,577,219 | 11/1996 | Timko et al. | 395/411 |
| 5,627,955 | 5/1997 | Gnirss et al. | 395/141 |
| 5,644,709 | 7/1997 | Austin | 395/185.06 |
| 5,675,540 | 10/1997 | Roohparvar | 365/185.22 |
| 5,815,509 | 9/1998 | Deng et al. | 371/21.2 |

OTHER PUBLICATIONS

IEEE, "1394–1995 Standard for a High Performance Serial Bus," 1995, USA.
ISO/IEC 13213:1994, ANSI/IEEE Std 1212 Cl. 8, 1994, pp. 79–100, USA.

*Primary Examiner*—Nadeem Iqbal
*Attorney, Agent, or Firm*—Haverstock & Owens LLP

[57] ABSTRACT

A graphical user interface is used to display contents of a configuration memory and includes a hierarchical window illustrating directories and entries within the configuration memory including the relationships between the directories and entries and a data window for displaying data stored within the configuration memory and signalling errors corresponding to the data. The errors are determined by processing the data being displayed to determine a reference value for each entry within the data and to determine if any offset value, pointer value and count value included within any entry references a memory location outside of a boundary of the memory. The reference value specifies a number of times each entry is referenced. Errors are signalled within the data window by displaying entries corresponding to errors in a first color and entries which do not include errors in a second color. The system further includes a bus structure node circuit for coupling the system to other devices over a bus structure. Appropriate headings of directories and entries are displayed with the data in the data window. The bus structure is preferably an IEEE 1394-1995 serial bus.

30 Claims, 12 Drawing Sheets

METHOD OF AND APPARATUS FOR VERIFYING RELIABILITY OF CONTENTS WITHIN THE CONFIGURATION ROM OF IEEE 1394-1995 DEVICES

FIELD OF THE INVENTION

The present invention relates to the field of error checking and verifying reliability of data retrieved from a memory device. More particularly, the present invention relates to the field of retrieving, verifying reliability and visually displaying contents of a memory in a graphical user interface.

BACKGROUND OF THE INVENTION

The IEEE standard, "1394-1995 Standard For A High Performance Serial Bus," is an international standard for implementing an inexpensive high-speed serial bus architecture which supports both asynchronous and isochronous format data transfers. Isochronous data transfers are real-time transfers which take place such that the time intervals between significant instances have the same duration at both the transmitting and receiving applications. Each packet of data transferred isochronously is transferred in its own time period. The IEEE 1394-1995 standard bus architecture provides multiple channels for isochronous data transfer between applications. A six bit channel number is broadcast with the data to ensure reception by the appropriate application. This allows multiple applications to simultaneously transmit isochronous data across the bus structure. Asynchronous transfers are traditional data transfer operations which take place as soon as possible and transfer an amount of data from a source to a destination.

The IEEE 1394-1995 standard provides a high-speed serial bus for interconnecting digital devices thereby providing a universal I/O connection. The IEEE 1394-1995 standard defines a digital interface for the applications thereby eliminating the need for an application to convert digital data to analog data before it is transmitted across the bus. Correspondingly, a receiving application will receive digital data from the bus, not analog data, and will therefore not be required to convert analog data to digital data. The cable required by the IEEE 1394-1995 standard is very thin in size compared to other bulkier cables used to connect such devices. Devices can be added and removed from an IEEE 1394-1995 bus while the bus is active. If a device is so added or removed the bus will then automatically reconfigure itself for transmitting data between the then existing nodes. A node is considered a logical entity with a unique address on the bus structure. Each node provides an identification ROM, a standardized set of control registers and its own address space.

The IEEE 1394-1995 standard defines a protocol as illustrated in FIG. 1. This protocol includes a serial bus management block 10 coupled to a transaction layer 12, a link layer 14 and a physical layer 16. The physical layer 16 provides the electrical and mechanical connection between a device or application and the IEEE 1394-1995 cable. The physical layer 16 also provides arbitration to ensure that all devices coupled to the IEEE 1394-1995 bus have access to the bus as well as actual data transmission and reception. The link layer 14 provides data packet delivery service for both asynchronous and isochronous data packet transport. This supports both asynchronous data transport, using an acknowledgement protocol, and isochronous data transport, providing real-time guaranteed bandwidth protocol for just-in-time data delivery. The transaction layer 12 supports the commands necessary to complete asynchronous data transfers, including read, write and lock. The transaction layer 12 also provides a path for isochronous management data to be transferred to the serial bus management block 10 via read operations with isochronous control compare-swap registers. The serial bus management block 10 contains an isochronous resource manager for managing isochronous data transfers. The serial bus management block 10 also provides overall configuration control of the serial bus in the form of optimizing arbitration timing, guarantee of adequate electrical power for all devices on the bus, assignment of the cycle master, assignment of isochronous channel and bandwidth resources and basic notification of errors.

Each node on the IEEE 1394-1995 serial bus provides an identification or configuration read only memory (ROM) in either a minimal or general format. The minimal ROM format includes a single quadlet (4 bytes) of data and provides only a twenty-four (24) bit company identifier. The general ROM format provides other information in addition to the company identifier. The company identifier is used to uniquely identify vendors that manufacture or specify components that are compatible with the IEEE 1394-1995 standard.

The minimal ROM format is illustrated in FIG. 2. The first byte of data has a value equal to one to specify that this ROM is of the minimal format and includes only a single quadlet. The minimal ROM implementation consists of this single quadlet of data which includes the company identifier field. The company identifier field is a twenty-four (24) bit field which includes a value representing the company or vendor that manufactured the device.

The general configuration ROM format is illustrated in FIG. 3. Each configuration ROM includes a bus_info_block and a root_directory. The root_directory contains additional entries which provide information or may provide a pointer to another directory. The directory entry format is illustrated in FIG. 4. An eight bit key is included within each directory entry. The key includes a two bit key type field and a six bit key value field. The key type field indicates the type of directory entry. The key value field specifies the particular directory entry. There are four types of entries: immediate, offset, leaf and directory. An immediate value entry has a key type of 0 and its meaning will depend on the type of entry with which it is associated. An offset entry has a key type of 1 and specifies a CRS address as a quadlet offset from the base address of the initial register space. A leaf entry has a key type of 2. A directory entry has a key type of 3. For both leaf entries and directory entries, the value of the entry specifies the number of quadlets between the current entry point and the ROM offset address.

Within the configuration ROM of FIG. 3, the info_length entry is an eight (8) bit entry which will have a value greater than one to specify that this ROM is of the general format. The value within the info_length entry specifies the number of quadlets contained within the following bus_info_block data structure. The crc_length entry is an eight (8) bit entry which includes a value specifying how many of the following quadlets within the configuration ROM are protected by the value within the rom_crc_value entry. The rom_crc_value entry is a sixteen (16) bit entry which includes a crc value used to verify the correctness of the data within the configuration ROM, as is well known in the art.

The bus_info_block entry is a block of data, having a format as illustrated in FIG. 5a, which includes information about the node and the bus structure to which it is coupled. The first quadlet of the bus_info_block entry contains ASCII representations of the characters "1394" to specify that the bus structure is an IEEE 1394-1995 bus structure. The isochronous resource manager capable (irmc) bit specifies whether or not the node is capable of serving as the isochronous resource manager for the bus. If the irmc bit is at a logical "1" level, then the node is capable of serving as the isochronous resource manager for the bus. Otherwise, if the irmc bit is at a logical "0" level, the node is not capable of serving as the isochronous resource manager. The cycle master capable (cmc) bit specifies whether or not the node is capable of serving as the cycle master for the bus. If the cmc bit is at a logical "1" level, then the node is capable of serving as the cycle master for the bus. Otherwise, if the cmc bit is at a logical "0" level, the node is not capable of serving as the cycle master. The isochronous (isc) bit specifies whether or not the node supports isochronous operations. If the isc bit is at a logical "1" level, then the node does support isochronous operations. Otherwise, if the isc bit is at a logical "0" level, the node does not support isochronous operations. The bus manager capable (bmc) bit specifies whether or not the node is capable of serving as the bus manager for the bus. If the bmc bit is at a logical "1" level, then the node is capable of serving as the bus manager for the bus. Otherwise, if the bmc bit is at a logical "0" level, the node is not capable of serving as the bus manager.

The cyc_clk_acc sub-entry within the bus_info_block entry is an eight bit entry which specifies the accuracy of the cycle master clock of the node in parts per million. If the cmc bit is set to a logical "1" level, signalling that the node is capable of serving as the cycle master, then the cyc_clk_acc entry contains a value between zero (0) and one hundred (100), representing the accuracy of the cycle master clock. Otherwise, if the cmc bit is at a logical "0" level, signalling that the node is not capable of serving as the cycle master, all of the bits within the cyc_clk_acc entry are set to a logical "1" level.

The max_rec sub-entry within the bus_info_block entry is a four bit entry which defines the maximum payload size of an asynchronous block write transaction addressed to the node. The range of the maximum payload size is from four bytes to 2048 bytes, as specified below in Table 1.

TABLE 1

Values of the max_rec entry

| max_rec (binary encoding) | Maximum size in bytes (decimal values) |
|---|---|
| 0000 | Not specified |
| 0001 | 4 |
| 0010 | 8 |
| 0011 | 16 |
| 0100 | 32 |
| 0101 | 64 |
| 0110 | 128 |
| 0111 | 256 |
| 1000 | 512 |
| 1001 | 1024 |
| 1010 | 2048 |
| 1011 to 1111 | Reserved |

The node_vendor_id sub-entry within the bus_info_ entry is a twenty four (24) bit entry which contains a value representing the node company identifier. The value within the node_vendor_id sub-entry is a copy of the node company identifier value within the node_unique_id leaf of the configuration ROM which will be discussed below. The chip_id_hi sub-entry is an eight (8) bit entry. The chip_id_low sub-entry is a thirty two (32) bit entry. Together, the values within the chip_id_hi and chip_id_low sub-entries comprise a forty (40) bit chip identifier value. The value within the chip_id_hi and chip_id_low sub-entries is a copy of the chip identifier value within the node_unique_id_leaf of the configuration ROM, which will be discussed below. Together, the values within the node_vendor_id, chip_id_hi and chip_id_low sub-entries form a sixty four (64) bit node unique identifier value.

The root directory within the configuration ROM contains a module_vendor_id entry, node_capabilities entry and node_unique_id entry. The module_vendor_id entry is a single quadlet which contains an immediate entry in the root directory that provides the company identifier of the vendor that manufactured the module. The first byte within the quadlet specifies the key type and key value for the module_vendor_id entry. The remaining three bytes of the quadlet contain the value representing the company identifier for the vendor.

The node_capabilities entry of the root directory is a single quadlet which contains an immediate entry in the root directory that describes the node capabilities. The first byte within the quadlet specifies the key type and key value for the node_capabilities entry. The remaining three bytes within the quadlet contain flags representing the capabilities of the node and specifying such things as whether or not a split_timeout register is implemented within the node, whether or not the node uses sixty four (64) bit addressing, whether or not the node uses a fixed addressing scheme, whether or not the state_bits.lost bit is implemented within the node and whether or not the state_bits.dreq bit is implemented within the node.

The node_unique_id entry is a single quadlet leaf entry in the root directory that describes the location of the node_unique_id leaf within the configuration ROM. The first byte within the quadlet specifies the key type and key value for the node_unique_id entry. The remaining three bytes within the quadlet contain an offset value which specifies the number of quadlets from the address of the node_unique_id entry to the address of the node_unique_id leaf within the configuration ROM.

The unit_directories field within the configuration ROM is used to provide additional information about units within a node. The value within a unit_directory entry points to a lower level leaf value in the configuration ROM that contains unit-specific information.

The root and unit leaves field contains root_leaf entries and unit_leaf entries. The unit_leaf entries are used to store information on specific units. The root_leaf entries are used to store bus-dependent information referenced by the entries within the root_directory. The node_unique_id leaf is a root_leaf entry. The node_unique_id leaf has a format as illustrated in FIG. 5b and contains a node unique identifying value. The node unique identifying value is a sixty four (64) bit number appended to a company identifying value to create a globally unique eighty eight (88) bit number. The value within the node_vendor_id entry is the node company identifying value from the root directory. The chip_id_hi value and the chip_id_lo value together form the chip identifying value also from the root directory.

The vendor_dependent_information entry within the configuration ROM contains vendor specific information about the node, units and/or bus.

The information within the configuration ROM of a device is used by other devices within the IEEE 1394-1995 serial bus network to which the device is coupled, in order to fully interact with and take advantage of the capabilities of the device. The information within the configuration ROM can also be used by the user in order to obtain information about the devices within the IEEE 1394-1995 serial bus network. However, for many typical users the raw data within the configuration ROM is meaningless.

The information in an IEEE 1394-1995 configuration ROM is stored as a block of memory organized as a tree structure. Within this tree structure, different types of tree nodes hold different types of data. Errors within this data will cause inaccuracies and inconsistencies within other devices relying on this data. For typical users, it is hard to verify the accuracy of the data within a configuration ROM of a device.

SUMMARY OF THE INVENTION

A method of verifying accuracy of data within a memory including a plurality of entries comprises the steps of processing each entry when the data is accessed to determine a reference value for each entry and denoting an error if the reference value for each entry is not equal to a comparison value. The reference value specifies a number of times each entry is referenced. The method further includes the steps of determining if any offset value, any pointer value and any count value included within any entry references a memory location outside of a boundary of the memory and denoting an error if a memory location outside of the boundary of the memory is referenced. The method further includes the step of displaying the entries within a graphical user interface displayed on a host system having a display and an input device. The steps of denoting an error include representing entries including an error in a first color and entries which do not include an error in a second color. The memory is preferably a configuration memory within a device coupled to an IEEE 1394-1995 serial bus network. The entries are preferably quadlets. The comparison value is preferably equal to one.

An apparatus for verifying accuracy of data within a memory including a plurality of entries comprises means for communicating with the memory to obtain the data from the memory, means for processing coupled to the means for communicating for processing each entry when the data is obtained from the memory to determine a reference value for each entry and means for marking an error coupled to the means for processing for marking errors if the reference value for any entry is not equal to a comparison value. The reference value specifies a number of times each entry is referenced. The means for processing also determines if any offset value, pointer value and count value included within any entry references a memory location outside of a boundary of the memory. The means for marking marks an error if any offset value, pointer value and count value references a memory location outside of the boundary of the memory. The apparatus further includes a graphical user interface for displaying the data. The means for marking marks an error by displaying entries corresponding to errors in a first color and entries which do not include errors in a second color. The memory is preferably a configuration memory within a device coupled to an IEEE 1394-1995 serial bus network. The comparison value is preferably equal to one.

An apparatus for verifying accuracy of data within a memory including a plurality of entries comprises a data interface coupled to receive the data from the memory, a processing circuit coupled to the data interface to process each entry when the data is received from the memory to determine a reference value for each entry and to determine if any offset value, pointer value and count value included within any entry references a memory location outside of a boundary of the memory and a display device coupled to the processing circuit to signal an error if the reference value for any entry is not equal to a comparison value and if any offset value, pointer value and count value references a memory location outside of the boundary of the memory. The reference value specifies a number of times each entry is referenced. The display device includes a graphical user interface to display the data received from the memory and error signals. Error signals are displayed by displaying entries corresponding to errors in a first color and entries which do not include errors in a second color. The memory is preferably a configuration memory within a device coupled to an IEEE 1394-1995 serial bus network. The comparison value is preferably equal to one.

A graphical user interface is displayed within a system having a control processor, a display, a memory and an input device. The graphical user interface is used to display contents of a configuration memory and includes a hierarchical window illustrating directories and entries within the configuration memory including the relationships between the directories and entries and a data window for displaying data stored within the configuration memory and signalling errors corresponding to the data. The errors are determined by processing the data being displayed to determine a reference value for each entry within the data and to determine if any offset value, pointer value and count value included within any entry references a memory location outside of a boundary of the memory. The reference value specifies a number of times each entry is referenced. Errors are signalled within the data window by displaying entries corresponding to errors in a first color and entries which do not include errors in a second color. The system further includes a bus structure node circuit for coupling the system to other devices over a bus structure. Appropriate headings of directories and entries are displayed with the data in the data window. The bus structure is preferably an IEEE 1394-1995 serial bus.

DETAILED DESCRIPTION OF THE PREFERRED EMBODIMENT

A graphical user interface including a visual representation of the hierarchy and data within a configuration ROM of a selected device on an IEEE 1394-1995 serial bus network is described in U.S. patent application Ser. No. 08/971,307, filed on Nov. 17, 1997 and entitled GRAPHICAL USER INTERFACE INCLUDING VISUAL REPRESENTATION AND DISPLAY OF CONTENTS WITHIN CONFIGURATION ROM OF DEVICES ON IEEE 1394 SERIAL BUS NETWORK, which is hereby incorporated by reference. The host system reads the data within a configuration ROM of a device coupled to the host system through the IEEE 1394-1995 serial bus network. This data is then represented within the graphical user interface which includes a hierarchy window and a data window.

Within the graphical user interface, the hierarchy window displays a representation of the directories and entries within the configuration ROM of the selected device. This representation of the directories and entries includes a representation of the relationships between the directories and entries. From the hierarchy window, a user can select any of the directories and entries within the configuration ROM using any appropriate cursor control device. Once a directory or entry is selected, the data in that directory or entry in the configuration ROM is displayed in the data window.

When data from a configuration ROM is displayed within this graphical user interface, the method of and apparatus for verifying reliability of contents within the configuration ROM of a device of the present invention, verifies the accuracy of the displayed data. The accuracy of the data is verified by performing certain error checks on the data and determining if errors exist within the data being displayed. A memory reference count check and an out of boundary check are preferably performed on the data to determine if errors exist within the data. When errors are found within the data being displayed, the user is notified through the graphical user interface.

Figure 6:
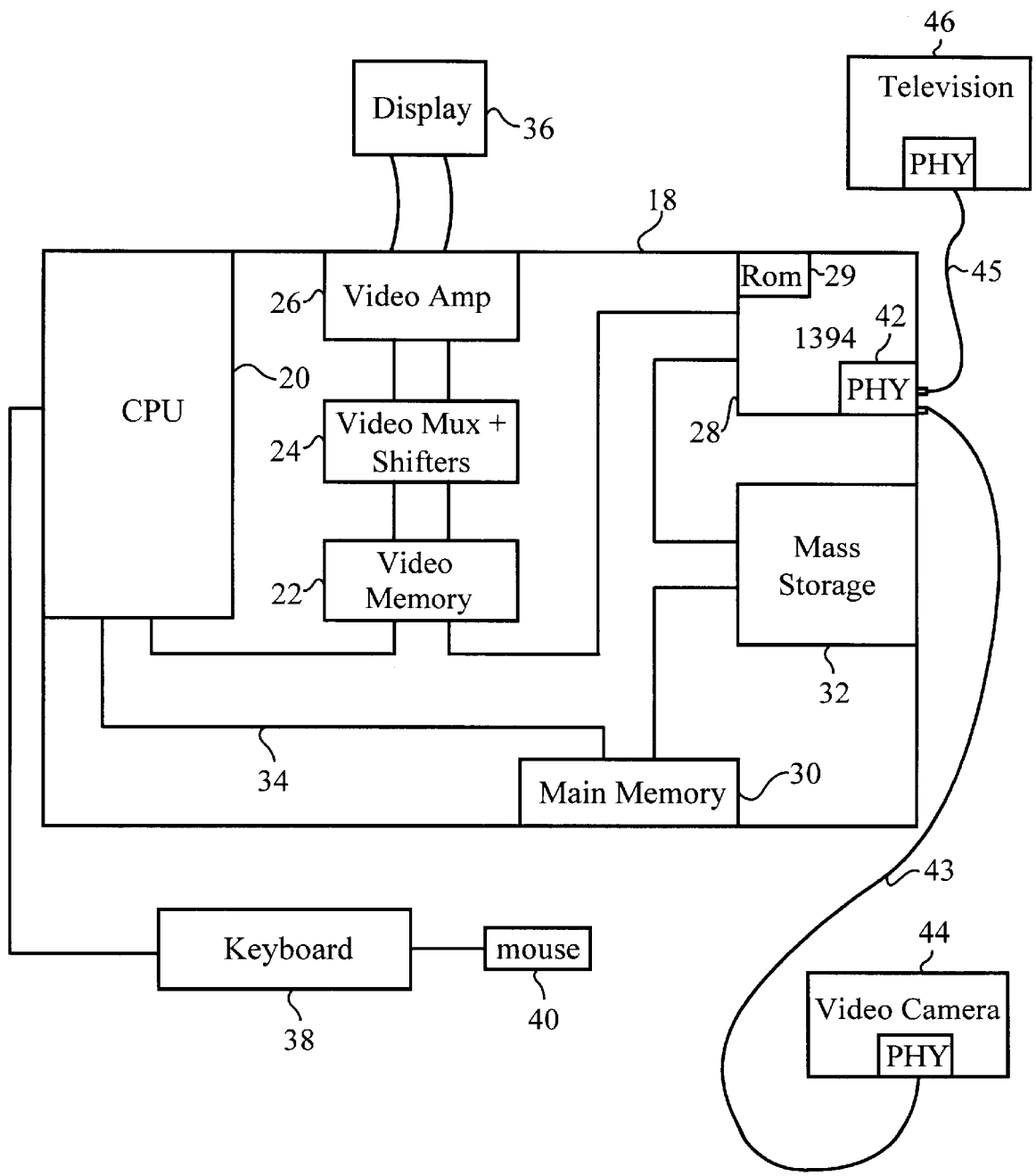
FIG. 6 illustrates a block diagram schematic of an exemplary computer system and IEEE 1394-1995 serial bus network.

While any appropriate device can implement a node, serve as a host system and display the graphical user interface, an exemplary computer system 18 implementing such a node is illustrated in FIG. 6. Preferably, the host system of the present invention is coupled to an IEEE 1394-1995 serial bus network. However, it should be apparent to those skilled in the art that the node of the present invention can be configured to couple to any appropriate bus or network structure. The computer system 18 includes a central processor unit (CPU) 20, a main memory 30, a video memory 22 and an IEEE 1394-1995 interface circuit 28, all coupled together by a conventional bidirectional system bus 34. The interface circuit 28 includes a configuration ROM 29 and a physical interface circuit 42 for sending and receiving communications on the IEEE 1394-1995 serial bus network. The physical interface circuit 42 includes ports which are preferably each configured to be coupled to IEEE 1394-1995 cables connected to other devices. The physical interface circuit is coupled to a television 46 by the IEEE 1394-1995 serial bus cable 45 and to a video camera 44 by the IEEE 1394-1995 serial bus cable 43.

Figure 1:
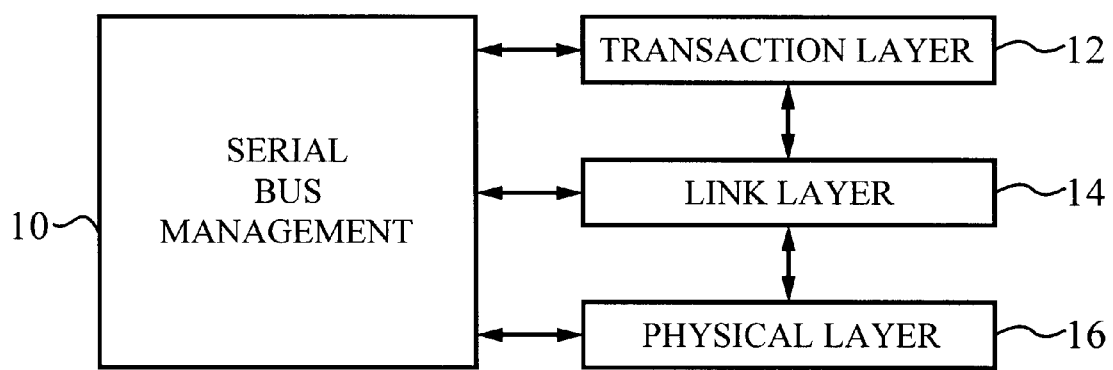
FIG. 1 illustrates a protocol of the IEEE 1394-1995 standard.
Figure 2:
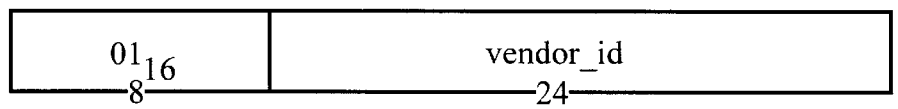
FIG. 2 illustrates a format of a minimal configuration ROM.
Figure 3:
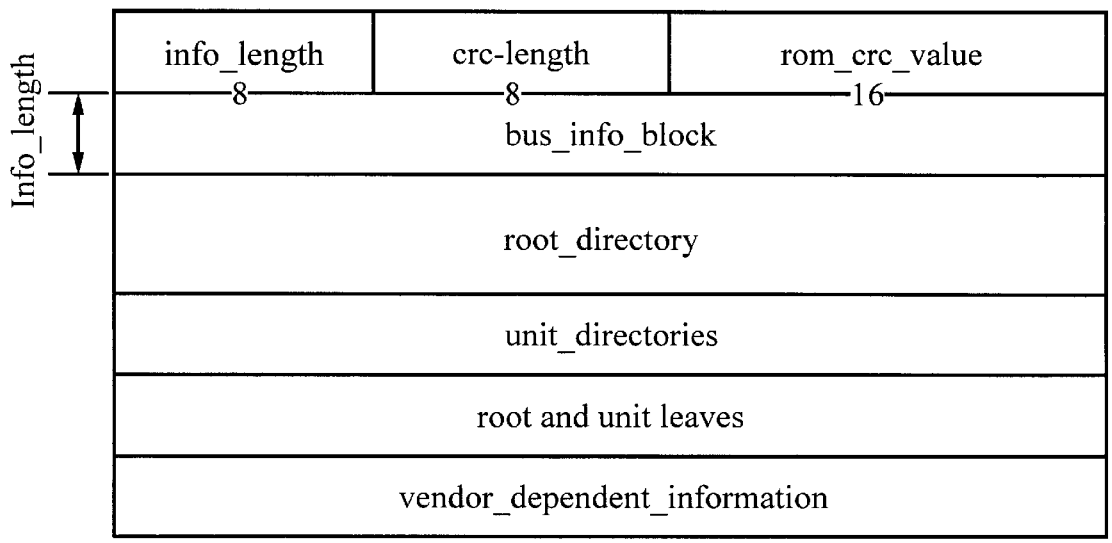
FIG. 3 illustrates a format of a general configuration ROM.
Figure 4:
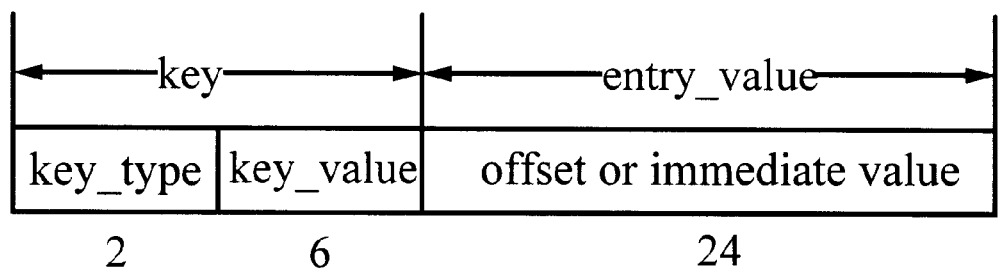
FIG. 4 illustrates a format of a directory entry.
Figure 5A:
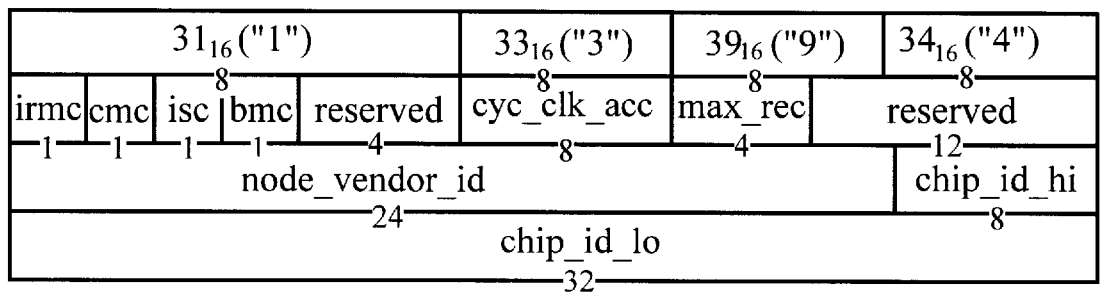
FIG. 5a illustrates a format of the bus_info_block field of a configuration ROM.
Figure 5B:
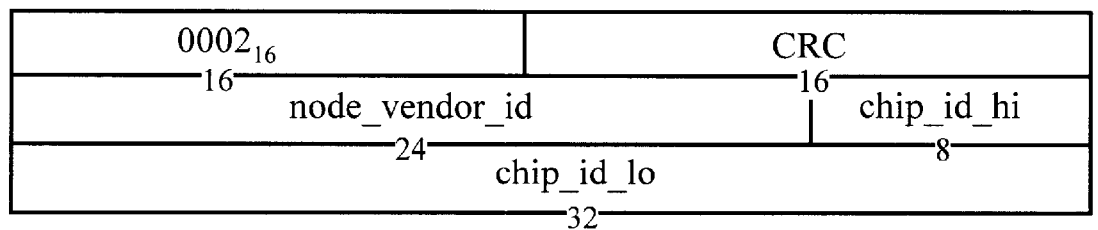
FIG. 5b illustrates a format of the node_unique_id leaf of a configuration ROM.

The interface circuit 28 includes a serial bus management block 10, a transaction layer 12, a link layer 14 and a physical layer 16 as illustrated in FIG. 1. In the preferred embodiment of the present invention, the interface circuit 28 is implemented on an IEEE 1394-1995 interface card within the computer system 18. However, it should be apparent to those skilled in the art that the interface circuit 28 can be implemented within the computer system 18 in any other appropriate manner, including building the interface circuit onto the motherboard itself. The mass storage device 32 may include both fixed and removable media using any one or more of magnetic, optical or magneto-optical storage technology or any other available mass storage technology. The system bus 34 contains an address bus for addressing any portion of the memory 22 and 30. The system bus 34 also includes a data bus for transferring data between and among the CPU 20, the main memory 30, the mass storage device 32, the video memory 22 and the interface circuit 28.

The computer system 18 is also coupled to a number of peripheral input and output devices including a keyboard 38, a mouse 40 and an associated display 36. The keyboard 38 is coupled to the CPU 20 for allowing a user to input data and control commands into the computer system 18. A conventional mouse 40 is coupled to the keyboard 38 for manipulating graphic images on the display 36 as a cursor control device.

A port of the video memory 22 is coupled to a video multiplex and shifter circuit 24, which in turn is coupled to a video amplifier 26. The video amplifier 26 drives the display 36. The video multiplex and shifter circuitry 24 and the video amplifier 26 convert pixel data stored in the video memory 22 to raster signals suitable for use by the display 36.

Figure 7:
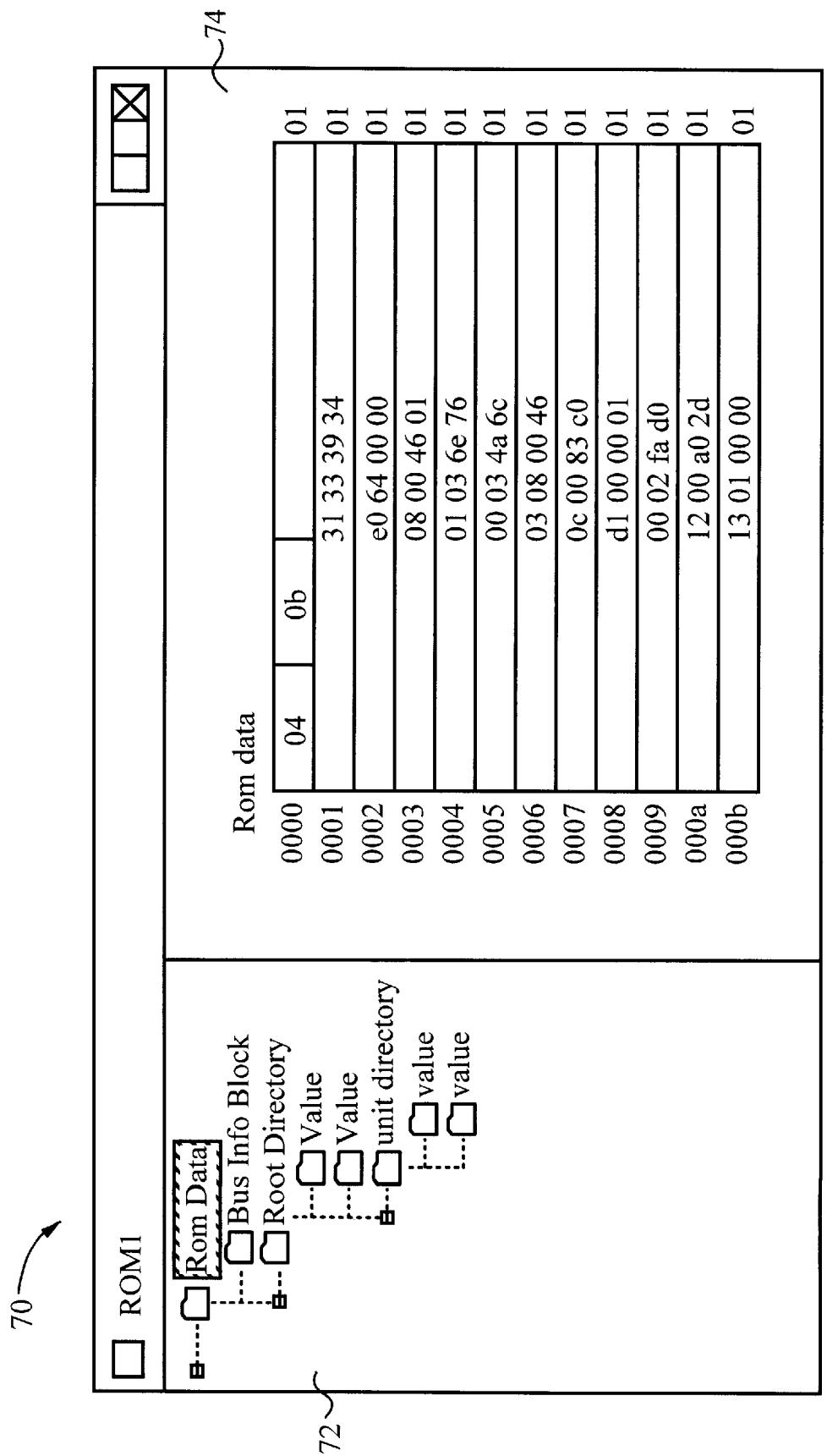
FIG. 7 illustrates a graphical user interface according to the present invention.

A graphical user interface is illustrated in FIG. 7. The graphical user interface will display a representation of the configuration ROM of any of the devices coupled to the host system on the IEEE 1394-1995 serial bus network. In the exemplary network illustrated in FIG. 6, this not only includes the host system computer 18, but also the television 46 and the video camera 44. The graphical user interface 70 includes a hierarchy window 72 and a data window 74. Within the hierarchy window 72, the directories and entries within the configuration ROM are displayed. The display within the hierarchy window also illustrates the relationships between the directories and entries by showing corresponding entries staggered under the appropriate directories. From the hierarchy window 72 a user can select a directory or entry for which the corresponding data from the configuration ROM will be displayed in the data window 74. A cursor control device is used by the user to select directories and entries for display. The cursor control device is used by the user to select directories and entries for display. The cursor control device can be a mouse, keypad, trackball, remote control or other device, depending on the configuration of the host system. Further, the cursor control device can be wired or wireless, using radio, infrared or any other appropriate technology.

The host system reads the data from the appropriate configuration ROM to be represented and displays the appropriate directories and entries in the hierarchy window 72 of the graphical user interface 70. If the configuration ROM is of a minimal format, then there will only be one directory in the hierarchy window 72 and no sub-entries. If the configuration ROM is of a general format, then all the directories and entries which include valid data will be represented in the hierarchy window 72. Using the cursor control device, if the user then selects a directory or entry in the hierarchy window 72, that directory or entry is highlighted and the corresponding data is displayed in the data window 74. In the example of the graphical user interface 70 illustrated in FIG. 7, the user has selected the ROM data directory which includes the entire ROM structure. Accordingly, all of the data from the configuration ROM is illustrated in the data window 74 of the FIG. 7.

Within the data window 74, the data is displayed in a quadlet format to correspond with the structure of the configuration ROM. Appropriate headings are added over the displayed data and the data of the selected quadlet is divided, within the quadlet, into the appropriate bits, bytes and multiple bytes for each entry in the quadlet. For example, in the data window 74 illustrated in FIG. 7, the heading ROM data is displayed over the block structure of the configuration ROM. Under the ROM data heading, the actual data is displayed in numbered quadlets. In the example illustrated in FIG. 7, because the ROM data field was selected, the first quadlet is divided into sub-parts which include the one-byte info_length value, the one-byte crc_length value and the two-byte rom_crc_value. As displayed within the data window 74, the first quadlet is divided into these entries so that the user can readily identify these values. The data within the remaining quadlets of the configuration ROM is then displayed under the first quadlet.

Figure 8:
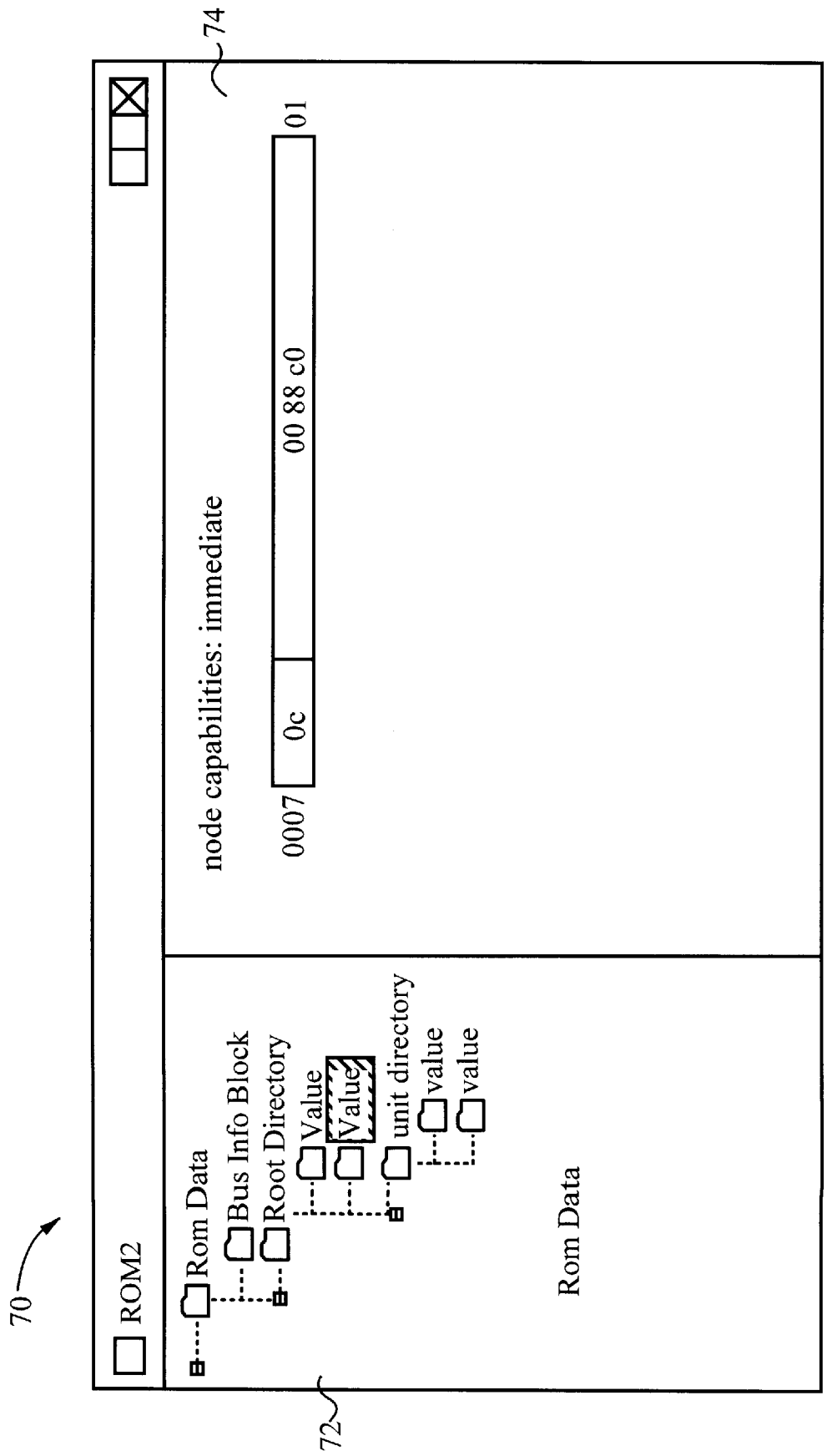
FIG. 8 illustrates a selection of a subfield of the root directory within the graphical user interface of the present invention.

The selection of a sub-entry of the root directory within the graphical user interface 70 of the present invention is illustrated in FIG. 8. In this example, the second value sub-entry under the root directory is selected in the hierarchy window 72. This second value sub-entry corresponds to the node capabilities entry of the root directory. Accordingly, in the data window a node capabilities heading is added over the quadlet of corresponding data. The first byte of this quadlet of data specifies the key type and key value for this node capabilities entry. The remaining three bytes of this quadlet of data correspond to values of flags which represent the capabilities of the node. Because this is an immediate value entry, only the quadlet of data corresponding to this entry is displayed within the data window 74.

Figure 9:
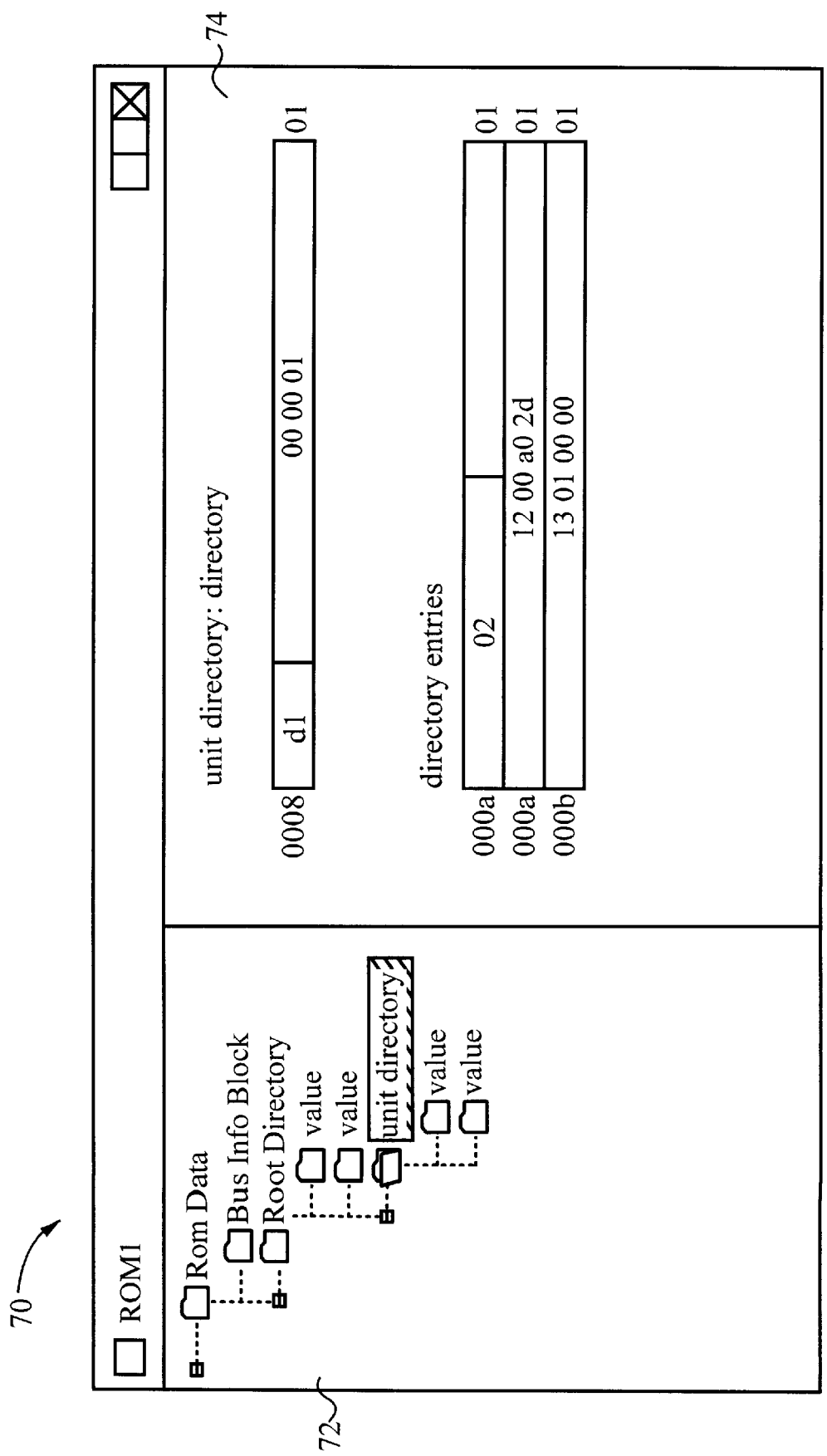
FIG. 9 illustrates a selection of the unit directory field within the graphical user interface of the present invention.

The selection of the unit directory within the graphical user interface 70 of the present invention is illustrated in FIG. 9. In this example, the unit directory within the selected configuration ROM is selected in the hierarchy window 72. When a directory is selected, preferably a directory heading is displayed above the quadlet entry corresponding to the values within the directory. Immediately beneath the quadlet corresponding to the values within the directory, a directory entries heading is displayed above the quadlet or quadlets corresponding to the values of the directory entries. In the example of FIG. 9, a unit directory heading is displayed above the quadlet of data representing the values within the unit directory entry. The last three bytes of this quadlet contain the offset value which points to the corresponding values of the unit directory entries. In this example, this offset is equal to one quadlet. Accordingly, one quadlet is skipped and the remaining quadlets are displayed under the heading directory entries in order to represent the values within the entries under this directory.

Figure 10:
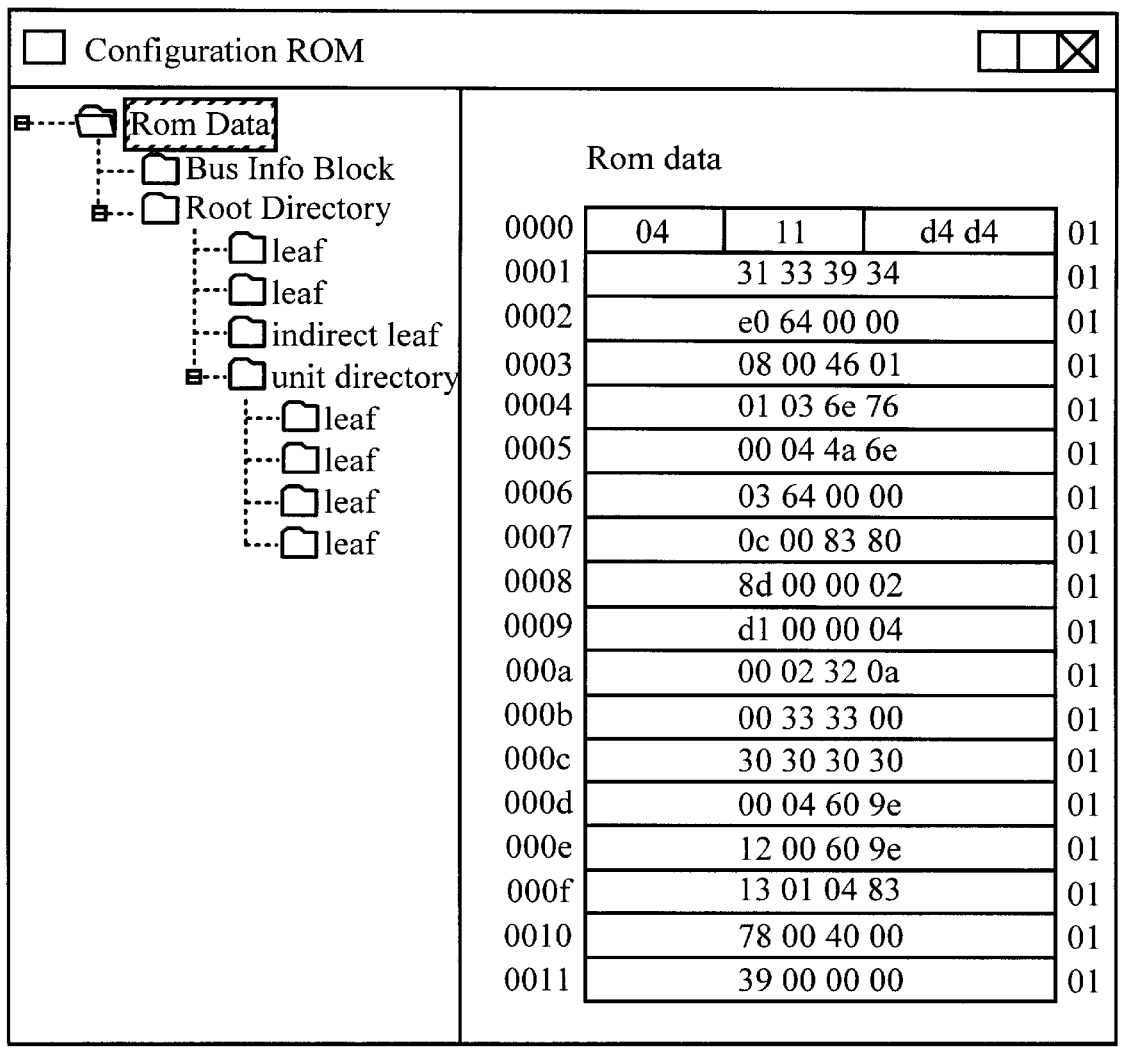
FIG. 10 illustrates a graphical user interface showing directory and leaf pointer values within one data entry pointing to another block of data.

The directory and leaf pointer values use offset numbers within one data entry to point to another block of data as illustrated in FIG. 10. The unit directory entry quadlet is included at the quadlet 0009 within the configuration ROM illustrated in FIG. 10. Within the unit directory quadlet, the last three bytes contain an offset value 00 00 04 which points to the first directory entry for the unit directory at the quadlet 000d. This first directory entry is four quadlets away from the unit directory quadlet. At the quadlet 000d, pointed to by the offset value within the directory quadlet, the directory entries begin. An indirect leaf quadlet is included at the quadlet 0008, illustrated in the configuration ROM of FIG. 10. Within the indirect leaf quadlet, the last three bytes contain an offset value 00 00 02 which points to the leaf entry quadlet 000a which is two quadlets away from the quadlet 0008. The leaf entry data for the indirect leaf quadlet is contained within the leaf entry quadlet 000a.

Figure 11:
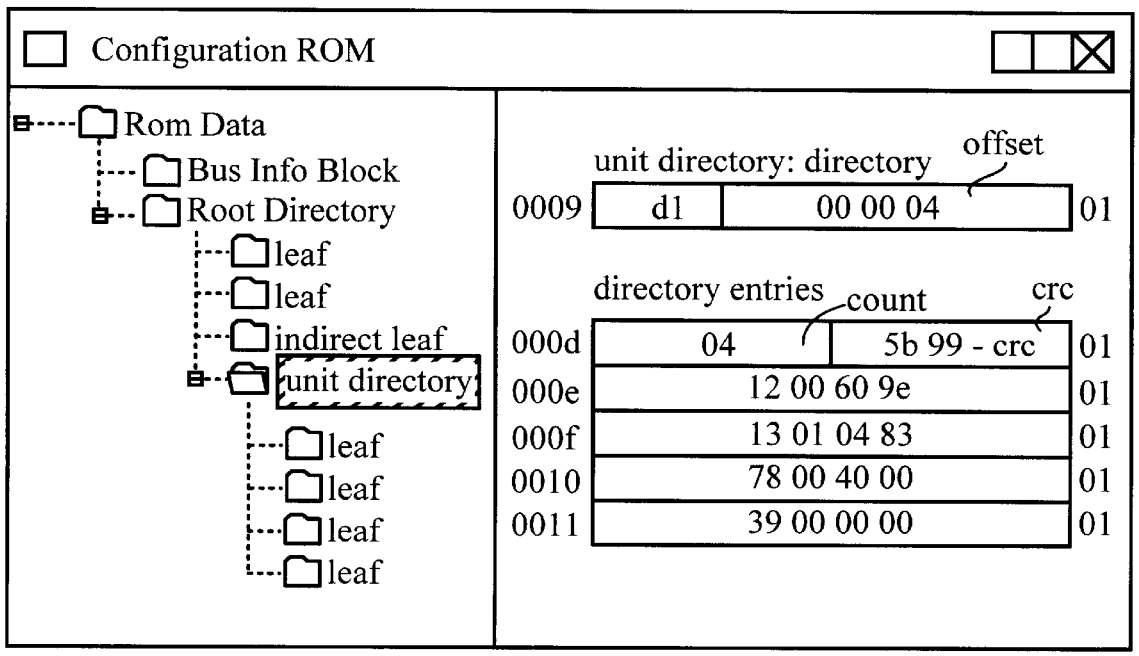
FIG. 11 illustrates a selection of the unit directory field within the graphical user interface of the present invention.

Within the graphical user interface illustrated in FIG. 11, the unit directory is selected. As described above, when the unit directory is selected, the unit directory entry quadlet 0009 and the directory entries 000d–0011 are displayed within the graphical user interface. This unit directory entry includes the offset value 00 00 04. Below the unit directory entry, the directory entry quadlets are displayed. The first directory entry quadlet includes an entry item count value 00 04 and a CRC value 5b 99. The CRC value is used for error checking in a known manner. The entry item count value specifies the number of subsequent quadlets which are included within the unit directory. In this example, the unit directory includes four directory entry quadlets below the first directory entry quadlet. This entry item count value included within the directory entries is prone to errors. Accordingly, a reliable method of verifying the accuracy of the entry item count is necessary in order to alert devices reading the configuration ROM and users viewing the data if errors are contained within the configuration ROM.

It has been determined that there are two types of common pointer errors within configuration ROMs. The first common type of pointer error occurs when a quadlet includes a wrong offset number value. In this case, the corresponding entry quadlets will begin at the wrong quadlet within the configuration ROM. The second common type of pointer error occurs when the offset number within a quadlet is correct, but the entry item count value within the first corresponding entry quadlet is wrong. In this case, an error will occur because the wrong number of corresponding entry quadlets will be included as corresponding entries.

The present invention verifies the reliability of the data within the configuration ROM using a memory reference count method and an address range checking method. These methods are then combined with the display of the data within the graphical user interface to notify the user when errors are present within the configuration ROM and where those errors exist. Within an IEEE 1394-1995 configuration ROM, each quadlet should be accessed or referenced only once. When data from a configuration ROM is read and displayed within the graphical user interface of the present invention, the number of times a quadlet is referenced is determined and displayed next to the quadlet. Preferably, the reference count value is displayed to the right of a corresponding quadlet, as illustrated in FIG. 11. In the graphical user interface illustrated in FIG. 11, there are no errors within the displayed configuration ROM data. This is evident to a user viewing the data because all of the reference count values in the right hand column are equal to 01. If the reference count value of any quadlet within the configuration ROM is not equal to one, this signals that there is an error within the configuration ROM data being displayed.

An address range checking method is also used to ensure that a pointer or count value does not exceed the boundary of the configuration ROM. If a count value includes a number of quadlets which would exceed the boundary of the configuration ROM, then there must be an error within the data in the configuration ROM. Also, if a pointer includes an offset value which exceeds the boundary of the configuration ROM, then there must be an error within the data in the configuration ROM. Preferably, if an out of boundary error is detected, the apparatus and method of the present invention will halt the error checking procedure and will mark the error within the graphical user interface. Within the preferred embodiment of the present invention, errors are marked within the graphical user interface by notating the error and displaying the entry at which the error was detected in a color which is different than the color used to display the remainder of the entries. Alternatively, the error can be denoted in any appropriate manner in order to notify the user that the data within the configuration ROM being displayed includes an error.

Figure 12:
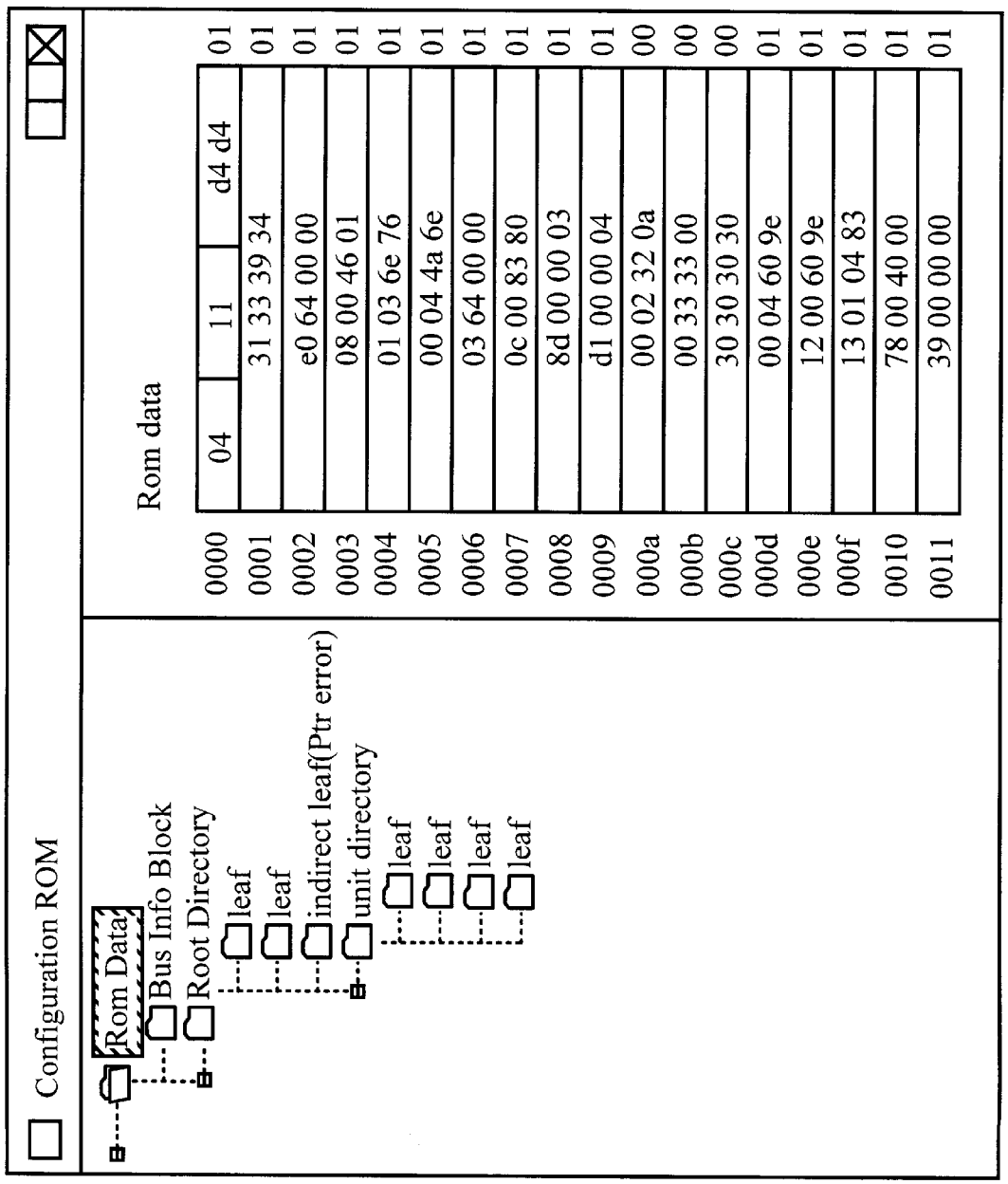
FIG. 12 illustrates an example of the display of data from a configuration ROM having an out of boundary error within the graphical user interface of the present invention.

An example of the display of data from a configuration ROM having an out of boundary error is illustrated in FIG. 12. In this example, the indirect leaf quadlet 0008 includes an offset value equal to 00 00 03 which points to the quadlet 000b. The quadlet 000b includes a count value of 00 33 which exceeds the boundary of the configuration ROM. Accordingly, the error checking is stopped and an error is noted in parentheses after the indirect leaf representation within the hierarchy window. Also, as described above, this entry is displayed in a different color than the other entries in order to notify the user of the error. Within this example, it should be noted that not all of the reference count values are correct. This occurs because not all of the entries were processed during the memory reference count check before the out of boundary error was detected. As soon as the out of boundary error was detected, the memory reference count check was suspended and the graphical user interface was updated to display the out of boundary error notification.

Figure 13:
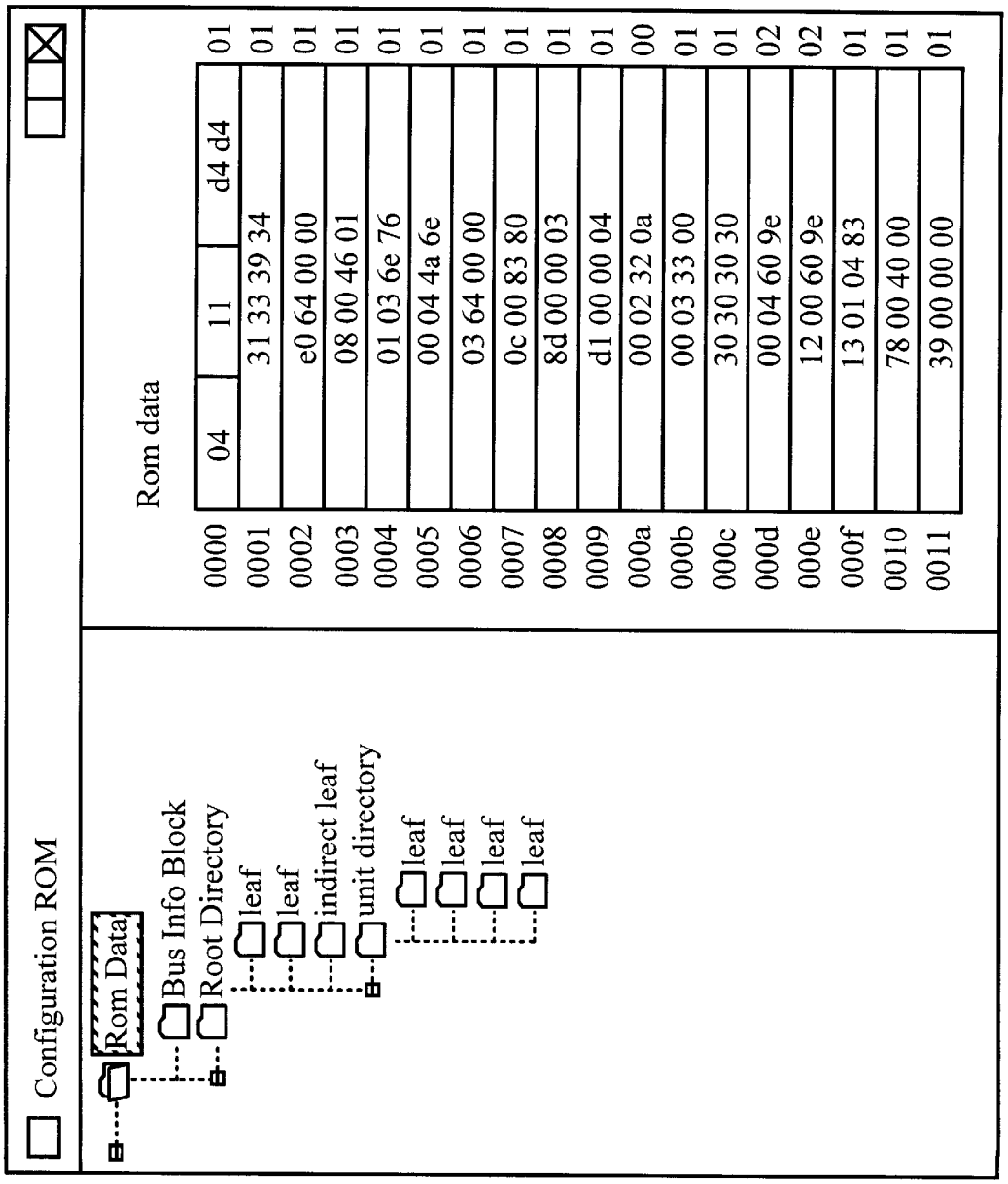
FIG. 13 illustrates an example of the display of data from a configuration ROM having a memory reference count error within the graphical user interface of the present invention.

An example of the display of data from a configuration ROM having a memory reference count error is illustrated in FIG. 13. In this example, the indirect leaf quadlet 0008 includes an offset value equal to 00 00 03 which points to the quadlet 000b. This offset value is an error and should equal 00 00 02. The quadlet 000b includes a count value of 00 03. This count value does not exceed the boundary of the configuration ROM. The system will accordingly continue its processing of each entry during the memory reference count check. Because the count value within the quadlet 000b is equal to 00 03, the next three quadlets 000c, 000d and 000e are corresponding entries and counted as being referenced when the system processes these entries. The unit directory quadlet 0009 includes a correct offset value equal to 00 00 04 which points to the quadlet 000d. Accordingly, the quadlet 000d is again counted as being referenced and a reference value equal to 02 is displayed beside the quadlet. The quadlet 000d includes a count value equal to 00 04 which does not exceed the boundary of the configuration ROM. However, this causes the quadlet 000e to also have a reference value equal to 02 which is displayed beside the quadlet 000e. The quadlet 000a has a reference value equal to 00 because it was never referenced due to the error caused by the incorrect offset value within the quadlet 0008.

Within the configuration ROM illustrated in FIG. 13, the quadlets 000d and 000e have reference values equal to 02 and the quadlet 000a has a reference value equal to 00. Because not all of the reference values for the quadlets within the configuration ROM are equal to one, there are memory reference count errors within the configuration ROM data being displayed within the graphical user interface. These memory reference count errors are denoted within the graphical user interface by preferably displaying the quadlets with the incorrect reference values in a different color than the other quadlets. These memory reference count errors are further denoted by the reference count values displayed next to the quadlets which are not equal to 01. By these notifications, a user is informed that errors do exist within the configuration ROM data being displayed within the graphical user interface.

In operation, the apparatus and method of the present invention verifies the accuracy of data within a configuration ROM which is displayed in the graphical user interface. Once the configuration ROM is selected for display within the graphical user interface, the system of the present invention performs a memory reference count check on the quadlets within the configuration ROM by processing each entry taking into account pointer, offset and count values within the entries and determining the number of times each entry is referenced using these values. This memory reference count check will determine if any quadlet is skipped over and never referenced or if any quadlet is referenced more than once. If either of these events occur, this signals that there is a pointer, offset or count error within the configuration ROM data being displayed. If during this memory reference count check, an offset value or count value within a quadlet will exceed the boundary of the configuration ROM, then the error checking is stopped and the out of boundary error is displayed within the graphical user interface. If there are no out of boundary errors, but one or more of the quadlets have reference values not equal to one, then those quadlets are denoted, preferably by displaying the quadlets including the errors in a different color, thereby notifying the user that errors exist within the configuration ROM. If no errors are found within the data, then no errors are denoted within the graphical user interface and the data of the configuration ROM is normally displayed within the graphical user interface.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent that the graphical user interface of the present invention can also be used in conjunction with devices coupled together in networks other than IEEE 1394-1995. Methods other than differing colors will also be apparent to those skilled in the art for denoting errors within the configuration ROM data being displayed within the graphical user interface.

We claim:

1. A method of verifying accuracy of data within a memory including a plurality of entries comprising the steps of:

a. processing each entry when the data is accessed to determine a reference value for each entry, wherein the reference value specifies a number of times each entry is referenced; and b. denoting an error if the reference value for each entry is not equal to a comparison value.

2. The method as claimed in claim 1 further comprising the steps of determining if any offset value, any pointer value and any count value included within any entry references a memory location outside of a boundary of the memory and denoting an error if a memory location outside of the boundary of the memory is referenced.

3. The method as claimed in claim 1 further comprising the step of displaying the entries within a graphical user interface displayed on a host system having a display and an input device.

4. The method as claimed in claim 1 wherein the step of denoting an error includes representing entries including an error in a first color and entries which do not include an error in a second color.

5. The method as claimed in claim 1 wherein the memory is a configuration memory within a device coupled to an IEEE 1394-1995 serial bus network.

6. The method as claimed in claim 1 wherein the entries are quadlets.

7. The method as claimed in claim 1 wherein the comparison value is equal to one.

8. A method of verifying accuracy of data within a memory including a plurality of entries comprising the steps of:

a. processing each entry when the data is accessed to determine if any data value within any entry references a memory location outside of a boundary of the memory and to determine a reference value for each entry, wherein the reference value specifies a number of times each entry is referenced; and b. denoting an error if any data value within any entry does reference a memory location outside of the boundary of the memory and if the reference value for each entry is not equal to a comparison value.

9. The method as claimed in claim 8 wherein the data value includes any offset value, pointer value and count value.

10. The method as claimed in claim 9 further comprising the step of displaying the entries within a graphical user interface displayed on a host system having a display and an input device.

11. The method as claimed in claim 10 wherein the memory is a configuration memory within a device coupled to an IEEE 1394-1995 serial bus network.

12. An apparatus for verifying accuracy of data within a memory including a plurality of entries comprising:

a. means for communicating with the memory to obtain the data from the memory;

b. means for processing coupled to the means for communicating for processing each entry when the data is obtained from the memory to determine a reference value for each entry, wherein the reference value specifies a number of times each entry is referenced; and c. means for marking an error coupled to the means for processing for marking errors if the reference value for any entry is not equal to a comparison value.

13. The apparatus as claimed in claim 12 wherein the means for processing also determines if any offset value, pointer value and count value included within any entry references a memory location outside of a boundary of the memory and the means for marking marks an error if any offset value, pointer value and count value references a memory location outside of the boundary of the memory.

14. The apparatus as claimed in claim 13 further comprising a graphical user interface for displaying the data.

15. The apparatus as claimed in claim 14 wherein the means for marking marks an error by displaying entries corresponding to errors in a first color and entries which do not include errors in a second color.

16. The apparatus as claimed in claim 15 wherein the memory is a configuration memory within a device coupled to an IEEE 1394-1995 serial bus network and further wherein the means for communicating communicates with the device over the IEEE 1394-1995 serial bus network.

17. The apparatus as claimed in claim 16 wherein the comparison value is equal to one.

18. An apparatus for verifying accuracy of data within a memory including a plurality of entries comprising:

a. a data interface coupled to receive the data from the memory;

b. a processing circuit coupled to the data interface to process each entry when the data is received from the memory to determine a reference value for each entry, wherein the reference value specifies a number of times each entry is referenced, and to determine if any offset value, pointer value and count value included within any entry references a memory location outside of a boundary of the memory; and c. a display device coupled to the processing circuit to signal an error if the reference value for any entry is not equal to a comparison value and if any offset value, pointer value and count value references a memory location outside of the boundary of the memory.

19. The apparatus as claimed in claim 18 wherein the display device includes a graphical user interface to display the data received from the memory and error signals.

20. The apparatus as claimed in claim 19 wherein error signals are displayed by displaying entries corresponding to errors in a first color and entries which do not include errors in a second color.

21. The apparatus as claimed in claim 20 wherein the data interface is an IEEE 1394-1995 interface and is coupled to an IEEE 1394-1995 serial bus.

22. The apparatus as claimed in claim 21 wherein the memory is a configuration memory.

23. The apparatus as claimed in claim 22 wherein the comparison value is equal to one.

24. In a system having a control processor, a display, a memory and an input device, a graphical user interface to display contents of a configuration memory comprising:

a. a hierarchical window illustrating directories and entries within the configuration memory including the relationships between the directories and entries; and b. a data window for displaying data stored within the configuration memory and signalling errors corresponding to the data, wherein the errors are determined by processing the data being displayed to determine a reference value for each entry within the data, wherein the reference value specifies a number of times each entry is referenced.

25. The system as claimed in claim 24 wherein the errors are further determined by determining if any offset value, pointer value and count value included within any entry references a memory location outside of a boundary of the memory.

26. The system as claimed in claim 25 wherein errors are signalled within the data window by displaying entries corresponding to errors in a first color and entries which do not include errors in a second color.

27. The system as claimed in claim 26 further comprising a bus structure node circuit for coupling the system to other devices over a bus structure.

28. The system as claimed in claim 27 wherein appropriate headings of directories and entries are displayed with the data in the data window.

29. The system as claimed in claim 28 wherein the bus structure is an IEEE 1394-1995 serial bus.

30. The method as claimed in claim 8 wherein the step of denoting an error includes representing entries including an error in a first color and entries which do not include an error in a second color.

* * * * *